(12) United States Patent
Koebernick et al.

(10) Patent No.: US 7,342,829 B2
(45) Date of Patent: Mar. 11, 2008

(54) MEMORY DEVICE AND METHOD FOR OPERATING A MEMORY DEVICE

(75) Inventors: Gert Koebernick, Dresden (DE); Konrad Seidel, Dresden (DE); Uwe Augustin, Dresden (DE)

(73) Assignee: Infineon Technologies Flash GmbH & Co. KG, Dresden (DE)

( * ) Notice: Subject to any disclaimer, the term of this patent is extended or adjusted under 35 U.S.C. 154(b) by 205 days.

(21) Appl. No.: 11/241,817

(22) Filed: Sep. 30, 2005

(65) Prior Publication Data

US 2007/0076464 A1    Apr. 5, 2007

(51) Int. Cl.
*G11C 11/34*    (2006.01)

(52) U.S. Cl. .......................... 365/185.19; 365/185.05; 365/185.18; 365/185.03

(58) Field of Classification Search ........... 365/185.19, 365/185.05, 185.18, 185.03
See application file for complete search history.

(56) References Cited

U.S. PATENT DOCUMENTS

| | | | |
|---|---|---|---|
| 6,490,201 B2 * | 12/2002 | Sakamoto | 365/185.22 |
| 2005/0057987 A1 | 3/2005 | Khalid et al. | |
| 2007/0030732 A1 * | 2/2007 | Micheloni et al. | 365/185.03 |
| 2007/0047314 A1 * | 3/2007 | Goda et al. | 365/185.18 |

* cited by examiner

*Primary Examiner*—Tuan T. Nguyen
(74) *Attorney, Agent, or Firm*—Slater & Matsil, L.L.P.

(57) ABSTRACT

A memory device (1) includes a memory array (2). The memory array (2) has at least one memory area (5) that includes a plurality of conductive lines (3) and a plurality of memory cells (4) connected to the conductive lines (3). The conductive lines (3) are arranged at positions (n) within the memory area (5). The memory cells (4) are erasable and are programmable by application of an electrical programming pulse (P) supplied via a respective conductive line (3). The memory device (1) is constructed such that for programming of a memory cell (4) an electrical programming pulse (P) is applied which has a programming pulse profile (PP) depending on the position (n) of a respective conductive line (3) to which the memory cell (4) is connected.

27 Claims, 5 Drawing Sheets

| n | 1 | 2 | 3 | ... | N |
|---|---|---|---|---|---|
| VP/V0 | 1.0 | 1.0 | 1.0 | ... | 1.0 |
| L/L0 | 1.02 | 0.95 | 1.07 | ... | 0.98 |

D = { VP/V0, L/L0 }; PP spans columns n, 1

FIG 8

| n | 1 | 2 | 3 | ... | N |
|---|---|---|---|---|---|
| VP/V0 | 1.04 | 1.06 | 0.96 | ... | 1.01 |
| L/L0 | 1.0 | 1.0 | 1.0 | ... | 1.0 |

D = { VP/V0, L/L0 }; PP spans columns n, 1

FIG 9

Providing a memory device 1 comprising a memory array 2 having a plurality of equally sized memory areas 5, each memory area 5 comprising a respective plurality of conductive lines 3 and a respective plurality of memory cells 4 connected to the conductive lines 3

↓

Applying a programming pulse P0 to all memory cells 4 of the first memory area 5' via the conductive lines 3, the programming pulse P0 having a programming pulse profile PP0 being uniform for all memory cells of the first memory area 5'

↓

Evaluating for each conductive line of the first memory area 5' the number of memory cells 4 which have actually been programmed via a respective conductive line 3

↓

Defining for each conductive line of the first memory area 5' an individual programming pulse profile PP, the individual programming pulse profile PP depending on the number of memory cells 4 connected to the respective conduvtive line 3 which have actually been programmed

↓

Storing programming pulse profile data D associated with the individual programming pulse profiles PP defined, the stored programming pulse profile data D serving to generate programming pulses P having programming pulse profiles PP being individual for each position n, within a memory area 5, of a conductive line 3 via which a programming pulse is applicable to memory cells connected thereto

MEMORY DEVICE AND METHOD FOR OPERATING A MEMORY DEVICE

TECHNICAL FIELD

The present invention relates generally to semiconductor devices and methods and, in a particular embodiment, to a memory device and method for operating a memory device.

BACKGROUND

The invention relates to memory devices comprising a memory array having a plurality of non-volatile memory cells, like NROM memory devices (nitride read only memory) or devices comprising floating gate transistor cells, for instance. The invention in particular refers, for instance, to flash memory devices comprising sectors of non-volatile memory cells, all memory cells of a particular sector being erased commonly if an erasing operation is performed in the respective sector of the memory array. The invention further refers to memory devices comprising memory cells that each are capable of storing at least one first bit at a first bit position and at least one second bit at a second bit position different from the first bit position, like twin-flash memory cells and multi-level cells.

In an actual memory device, predefined electrical potentials are provided in order to erase, to program or to read out memory cells. Conventionally the magnitude of these potentials is uniform for all memory cells of the memory device to which these respective potentials are applied. For instance, for programming any one of the memory cells, a predefined programming voltage is applied to an electrode of the respective memory cell to be programmed. The programming voltage is applied to the memory cell via a conductive line like a bitline, for instance. Further lines like wordlines, for instance, may be used for biasing further electrodes of the memory cells. However, in any case at least one predefined potential (like the programming voltage) is to be supplied in order to change the information stored in the memory cell.

The minimum voltage at which the information is actually changed in a memory cell is hereinbelow referred to as the threshold voltage. If a programming voltage having a magnitude larger than the threshold voltage of the memory cell is applied, the memory cell is programmed.

In an actual memory device the threshold voltage of a particular memory cell depends on the dimensions of microelectronic substructures of the respective memory cell. The threshold voltage mainly depends on the gate length. Furthermore, spatial dimensions like the gate oxide thickness, like dopant concentration profiles of source/drain regions and of LDD regions (lightly doped drain) as well as parasitic effects resulting from microelectronic structures arranged close to the memory cell all may influence the exact magnitude of the threshold voltage of the individual cell. Accordingly, in an actual memory device each memory cell has a slightly different threshold voltage.

In particular in case of flash memory devices, apart from tolerances in the exact dimensions of the structural elements of the memory cell (due to lithographic parameters and misalignments), the voltage-drain-source effect, for instance, influences the threshold voltage. The voltage-drain-source effect entails different degrees of programming efficiency that depending on whether, in a transistor cell structure having two bit positions for storing one respective bit (or multi-bit due to multilevel cells), the other bit is programmed or not. Furthermore, other intrinsic and systematic design related effects also may influence the threshold voltage.

Furthermore, in case of a flash memory having NROM twin flash memory cells, pairs of memory cells are provided, each pair being formed of a transistor structure based on MOSFET technology and including a charge-trapping layer like a silicon nitride layer capable of storing two digital information above a respective first and/or second source/drain region. Depending on whether the programming voltage is supplied to a conductive line contacting the first source/drain region of the memory cell or to the other conductive line contacting the second source/drain region of the memory cell, either a first bit (close to the first source/drain region) or a second bit (close to the second source/drain region) is programmed. Since the total amount of electrical charges stored in the charge-trapping layer is the sum of the electrical charges constituting the first and the second bit, the threshold voltage for programming one of these bits depends on the programming status (programmed or erased) of the respective other bit. Due to this program-neighbor-effect, in the respective other cell of the cell pair leakage currents to a further conductive line (for instance to an adjacent conductive line) influence the threshold voltage for programming the other bit in the cell pair.

The threshold voltage of an individual memory cell is further influenced by differences of the layout and the design of the memory cells and their contacts to conductive lines. In general any arrangement of conductive elements in close distance from the memory cell influences the magnitude of a threshold voltage.

Accordingly, there are several influences on the threshold voltage of the particular memory cell, at least some of these influences being systematic due to the overall design of the memory array.

Usually a memory array comprises a plurality of equally-sized subsections (memory areas) arranged at distances from one another, which distances are larger than the distances between two memory cells within the same subsection. Due to the limited access time for programming the memory cells and to the limited conductivity of thin conductor lines accessing the memory cells, segmented conductive lines (segmented wordlines or bitlines) are usually provided. Furthermore, sense amplifiers arranged in plural columns or rows further subdivide the memory array, for instance. Accordingly, any memory array comprises equally-sized memory areas that have the same corresponding internal design and layout. Since all memory areas are equally sized, each memory area comprises the same number of memory cells and the same number of conductive lines connecting the memory cells. Even when considering that the internal design of many of these memory areas is mirror-inverted with view to the internal design of further memory areas, all these memory areas are corresponding to one another.

In case of flash memories comprising sectors of commonly erasable memory cells, the memory areas are subsections of the sectors, for instance. Within a memory area, the threshold voltage of the memory cells is at least partially influenced systematically by the position, within the memory area, of the conductive line (for providing the programming voltage) to which the memory cell is connected.

SUMMARY OF THE INVENTION

In one aspect, the present invention improves programming of memory devices that include a plurality of equally-sized memory areas. In particular, one embodiment of the invention obtains a uniform performance of programming operation that is less dependent on the position of the memory cell within the memory array. Furthermore, in another aspect, the invention compensates varying magnitudes of the threshold voltage of the memory cells comprised in the memory device and to improve reliability of programming operation of a memory device.

In a first embodiment, a memory device includes a memory array. The memory array has at least one memory area that includes a plurality of conductive lines and that includes a plurality of memory cells coupled to the conductive lines. The conductive lines are arranged at positions within the memory area. The memory cells are erasable and are programmable by application of an electrical programming pulse supplied via a respective conductive line. The memory device is constructed such that, for programming of a memory cell, an electrical programming pulse is applied that has a programming pulse profile depending on the position of a respective conductive line to which the memory cell is connected.

One idea of the invention is to provide, for programming of the memory cells, programming pulses that compensate systematic influences on the threshold voltage of the respective memory cells resulting from their positions within the memory array. In particular, embodiments of the invention exploit the circumstance that the memory array includes at least one (or a plurality of plural equally-sized) memory area in which the same systematic influences on the threshold voltage or on the programming efficiency of memory cells at corresponding positions within the memory area occur. Such systematic influences may, for instance, occur at an edge of a memory area or at another position with specific arrangements of surrounding structural elements. However, in general these systematic influences are observed all over the memory area. In addition, further systematic influences depending on the respective technologiy and concept of the memory array design may occur at the edges of the memory areas, for instance.

According to embodiments of the invention, a memory device is provided that allows to generate programming pulses having non-uniform pulse profiles. The programming pulse profiles depend on the position of the conductive lines (to which the memory cells are connected) within a memory area.

Preferably, the memory device generates a programming pulse having a programming pulse profile depending on the position, within the memory area, of the conductive line to which the memory cell to be programmed is connected. Any memory cell that is addressed for a programming operation receives a programming pulse that is individual for the respective conductive line. Thereby systematic influences of the conductive line position within the respective memory area (like a position near a memory area edge or a centred position) are compensated, for instance.

Preferably, the memory array comprises a plurality of equally-sized memory areas, each memory area comprising a respective plurality of conductive lines and a plurality of memory cells connected to the respective conductive lines, and the conductive lines of each memory area are arranged at positions that correspond to positions of the conductive lines of the other memory areas. According to this embodiment the programming pulse profiles depend on the internal positions of the conductive lines within a respective memory area. Preferably, programming pulse profiles are independent from the particular memory area in which a conductive line is arranged. Since all memory areas are equally designed like duplicates of one another, the positions at which the conductive lines are arranged within a memory area are common to all memory areas. Accordingly, systematic influences depending on the memory area-internal position of conductive lines preferably are compensated by programming pulse profiles being individual for each conductive line of a memory area but being uniform for all memory areas.

Preferably, the memory device, in order to program a memory cell connected to a conductive line, generates a programming pulse having a programming pulse profile depending on an area-internal position of the conductive line to which the memory cell to be programmed is connected. Accordingly, each memory cell connected to a particular conductive line receives a particular programming pulse (if selected for a programming operation) which is individual for the particular conductive line. Thereby systematic influences of the conductive line position within the respective memory area (like a position near a memory area edge or a centred position) is compensated, for instance.

Preferably, the memory device attributes programming pulse profile data corresponding to programming pulses having individual programming pulse profiles to the conductive lines of the memory areas, wherein to all conductive lines located at the same corresponding position in any one of the respective memory areas the same programming pulse profile data are attributed. Thereby systematic influences of the internal memory area design occurring in all memory areas are compensated.

Preferably, the programming pulse profile data are stored in the memory device. The programming pulse profile data may be stored in a separated memory region of the memory device or in a part of the memory array reserved for programming pulse profile data, for instance.

According to one embodiment, the memory device, for programming of a memory cell, generates a programming pulse having a programming pulse width depending on the programming pulse profile data. Furthermore, the programming pulse may be generated such that the programming voltage is uniform for all memory cells of the memory area. According to this embodiment, the magnitude of the programming voltage supplied to any conductive line is chosen identical for all conductive lines of the memory device and the width of the respective programming pulse is varied in accordance with the position of the respective conductive line to be biased. Accordingly, systematic influences on the threshold voltage are compensated.

According to another embodiment, the memory device, for programming of a memory cell, generates a programming pulse having a programming voltage depending on the programming pulse profile data. Furthermore, the memory device may be configured such that the programming pulse width is uniform for all memory cells of the memory array. According to this embodiment the pulse width is chosen identical for all conductive lines and for each memory cell to be programmed via the respective conductive line. The programming pulse, therefore, has a magnitude (that is a programming voltage magnitude) associated with the programming pulse profile data and depending on the respective position of the conductive line within the respective memory area.

Furthermore, of course it is possible to combine programming pulse width variation and programming voltage variation with one another.

Preferably the conductive lines are bitlines.

Preferably the non-volatile memory cells each comprise a charge-trapping layer stack disposed between a respective wordline and a respective active area. The wordlines are extending in another direction than the bitlines. The wordlines may be disposed directly on the charge-trapping layer stack. The charge-trapping layer stack preferably comprises a charge-trapping layer sandwiched between a bottom dielectric layer and a top dielectric layer. The dielectric layers may be oxide layers. The charge-trapping layer preferably is a nitride layer, for instance a silicon nitride layer. The charge-trapping layer serves to store electrical charges in locally bound positions. The locally bound positions in which the charges are storable preferably are arranged, in lateral direction, at opposed ends of a channel region close to two source/drain regions. Depending on the amount of electrical charges scattered into the charge-trapping layer at the respective bit position (due to the voltage applied to the respective conductive line), plural bits are storable at each bit position of a multi-level cell.

According to a preferred embodiment, the memory array comprises a plurality of sectors, each sector comprising a plurality of equally-sized memory cells, the memory cells of all memory areas of a sector being commonly erased when erasing memory cells of the respective sector. According to this embodiment, a flash memory device is provided comprising sectors of memory cells that are only erasable commonly and simultaneously. However, the memory areas of equal size and internal design are, preferably, sub-sections of the sectors and are much smaller than the sectors. For instance, a memory device may comprise a memory array having 1,024 or 4,096 sectors, for instance, each sector comprising $2^n$ memory areas, for instance 64 or 128 memory areas, and each memory area comprising 66 bitlines and 256 wordlines. Of course these numbers are just for illustration and are arbitrary.

According to an exemplary embodiment of the memory device, for programming of a memory cell connected to a conductive line disposed along an edge of any one of the memory areas, generates a programming pulse having a programming pulse profile being different from programming pulse profiles for programming of memory cells connected to conductive lines disposed more distant from the edges of the memory areas. Accordingly, the programming pulse profile data (which in general generate programming pulses of individual pulse profiles for each conductive line positioned within the memory areas) generate particularly different programming pulse profiles depending on whether a memory cell arranged close to an edge of a memory area or whether a memory cell arranged more distant from the edges of a memory area is to be programmed. Thereby increased influences of chip internal design at the edges and the circumference of the respective memory areas on the threshold voltage are compensated, for instance, by increased or reduced programming pulse magnitude and/or programming pulse width.

Preferably, each memory cell is connected to a respective first and second conductive line via which the programming pulses are suppliable to the respective memory cell, and preferably each memory cell at least is capable of storing a first bit and a second bit. In particular, preferably each memory cell is capable of storing at least one first bit in a first bit position and at least one second bit in a second bit position different from the first bit position. Accordingly, a memory device comprising memory cells for storing bits in at least two different bit positions is provided, at each bit position the respective bit(s) being programmable by application of a programming pulse to one of the conductive lines to which the respective memory cell is connected. In case that the memory device is a flash memory device, the memory cells preferably are twin-flash memory cells. In particular in case of NROM memory cells, the first and second bits are storable by electrical charges stored in locally bound positions in a first region and a second region of a charge-trapping layer. The memory cells preferably are multi-level cells that are capable of storing more than one bit. In case that the multi-level memory cells, more than one bit is storable at each of the two bit positions. For instance, at a first bit position as well as at a second first bit position a multitude of bits (for instance between 2 and 4 bits) may be storable. The first and second bit positions for instance are arranged near opposite source/drain regions of a memory cell transistor structure.

Preferably, the memory device is configured such that the at least one first bit of a memory cell is programmed by applying the programming pulse to the memory cell via the first conductive line and that the at least one second bit of the memory cell is programmed by applying the programming pulse to the memory cell via the second conductive line. Accordingly, the first bit storable at the first bit position (close to a first source/drain region) is programmable by application of a programming pulse via the first conductive line whereas the second bit storable at the second bit position (close to a second source/drain region) is programmable by application of a programming pulse via the second conductive line. In case of multi-level cells, all bits storable at the first bit position (close to the first source/drain region) are programmable by application of programming pulses via the first conductive line whereas those bits storable at the second bit position (close to the second source/drain region) are programmable by application of programming pulses via the second conductive line. The respective programming pulses may depend on the number of bits already stored at the respective bit position (and may further depend on the number of bits already stored at the respective other bit position). According to embodiments of the invention, the programming pulses further depend on the position of the respective conductive line (to which the respective memory is connected) within the memory area.

Accordingly, for programming a first bit, a programming pulse is applied to the first conductive line to which the memory cell is connected whereas a second bit is programmed by applying a corresponding programming pulse to the second conductive line to which the memory cell is connected. Apart from these conductive lines, which preferably are bitlines, each memory cell is connected to a respective wordline. For programming the memory cell, a wordline potential is applied to the wordline, which wordline potential enables programming of the memory cell (or of at least of one bit of the memory cell) by additionally applying a programming pulse to one of the bitlines at a time when the wordline is still biased with an appropriate wordline potential. By simultaneous application of the wordline potential to the wordline and of the programming pulse to one of the bitlines, a bit of the memory cell is programmed.

In another embodiment, the invention discloses a method for operating a memory device that includes a memory array having at least one memory area that comprises a plurality of conductive lines and a plurality of memory cells connected to the conductive lines, the memory cells being programmable by application of a programming pulse supplied to the conductive line to which the memory cell is connected, wherein programming of a memory cell includes generating a programming pulse having a programming pulse profile that depends on a position, within the memory area, of the conductive line to which the memory cell is connected.

By this method the memory device is operated such that programming pulses having a pulse profile appropriate for compensating systematic influences of the chip design on the threshold voltages are generated. Accordingly, each time when any memory cell is to be programmed (selectively to all other memory cells of a memory area), a programming pulse having a pulse profile specific for the position of the conductive line (to which the memory cell to be programmed is connected) is generated and transmitted to the respective conductive line.

The position of a conductive lines within the memory area may be identified by the number of the respective conductive lines within the memory area or within a sector. For instance, the conductive line address (like a bitline address) may be used to identify the position of the conductive line. Alternatively, reversed conductive line numbers (starting from the largest number and ending with "0") may be used for identification of the conductive line position, for instance.

Preferably, programming of a memory cell includes generating a programming pulse in accordance with programming pulse profile data stored in the memory device. The programming pulse profile data constitute the desired pulse profile to be generated when memory cells are to be programmed. Accordingly, the programming pulse profile data, for instance, define the temporal length (duration) of the programming pulse profile to be established (the pulse width) and/or the programming voltage (that is the magnitude of the programming pulse). Accordingly, the memory device reads out those programming pulse profile data that correspond to the position of the respective conductive line and generates one programming pulse having the desired programming pulse profile in accordance with the programming pulse profile data. The desired programming pulse is then transmitted through the respective conductive line to the memory cell to be programmed.

Preferably, programming of a memory cell includes generating a programming pulse having a pulse width being individual for the conductive line to which the memory cell to be programmed is connected, the programming pulse being defined by programming pulse profile data associated with the position, within the memory area, of the conductive line. Furthermore, programming of the memory cell includes generating a programming pulse having a programming voltage being uniform for all memory cells of the memory array.

Alternatively, programming of a memory cell includes generating a programming pulse having a programming voltage being individual for the conductive line to which the memory cell to be programmed is connected, the programming pulse being defined by programming pulse profile data associated with a position, within the memory area, of the conductive line. Furthermore, the programming pulse width of the programming pulses preferably are chosen uniform for all memory cells of the memory array.

Of course, individual pulse width variation and programming voltage variation may be combined with one another, each depending on the respective position of the respective conductive line within the memory area.

Preferably the memory device is configured such that each time when a memory cell is to be programmed, a respective electrical programming pulse having a programming pulse profile that depends on a position, within the respective memory area, of the conductive line to which the respective memory cell is connected is generated.

Preferably the memory cells each comprise source/drain regions connected to the respective conductive line, the generated programming pulse being supplied to the source/drain region of the respective memory cell to be programmed.

In particular, twin flash memory cells may be used that each form a cell pair realized by one single transistor structure but comprising two portions, each portion storing one respective bit or, in case of multi-level cells, respective plural bits (for instance two respective bits on each portion or bit position). The bit of the respective portion of the pair of memory cells is storable or stored in a region of a charge-trapping layer arranged in lateral direction above one respective source/drain region. A twin flash memory cell pair is connected to two conductive lines (bitlines), one of the conductive lines being used as a sensing line and the other conductive line being used as a bitline for programming one of the bits in the twin flash cell pair. When the other conductive line to which the twin flash cell is connected is supplying the programming pulse, the other bit is programmed in the twin flash memory cell. When the first conductive line supplies the programming pulse, that portion of the twin flash memory cell (in which a bit is programmed thereby) is considered to be connected to the first conductive line. Accordingly, the other portion of the twin flash memory cell is connected to the second conductive line.

In another embodiment, the invention provides a method for configuring and operating a memory device comprising a memory array having at least one memory area that comprises a plurality of conductive lines and a plurality of memory cells connected to the conductive lines, the memory cells being programmable by application of a programming pulse supplied to the conductive line to which the respective memory cells are connected, wherein the method comprises the steps of:

a) sequentially programming all memory cells of a first memory area using a uniform programming pulse having a programming pulse profile being uniform for all memory cells of the first memory area;

b) evaluating for each conductive line of the first memory area the number of memory cells that have actually been programmed in step a);

c) defining for each conductive line of the first memory area an individual programming pulse profile, the individual programming pulse profiles depending on the number of memory cells connected to the respective conductive line that have actually been programmed in step a); and d) storing programming pulse profile data associated with the individual programming pulse profiles defined, the stored programming pulse profile data serving to generate programming pulses having programming pulse profiles that depend on the positions of the conductive lines within the memory area.

According to this method, programming pulse profile data are stored that are defined for each conductive line after testwise programming of a first memory area and evaluating of the number of memory cells of the first memory area that have actually been programmed. The first step a) of programming all memory cells of the first memory area is performed using a programming pulse that has a uniform programming pulse profile (that does not depend on a particular conductive line or the number or position thereof). The uniform programming pulse serves to provisionally obtain a test result indicating the degree of reliability of programming when applying the uniform programming pulse to the individual conductive lines. By evaluating the number of memory cells that have been programmed thereby, an indicator for the reliability is obtained, which is used in step c) for defining individual programming pulse profiles (for instance having individual pulse widths for each conductive line) to be applied later when programming of memory cells during operation of the memory device.

In particular, the individual programming pulse profiles are chosen such that the respective numbers of programmed memory cells for each conductive line evaluated in steps a) and b) are taken into account. For instance, in the case that for a particular conductive line the number of memory cells actually programmed in step a) is less than the total number of memory cells connected to this conductive line (or less than a portion thereof, like 90%), an improved individual programming pulse profile having an increased programming voltage and/or an increased temporal pulse width is defined for this particular conductive line. For each conductive line an individually optimized programming pulse profile is defined for programming pulses to be applied later to the respective conductive line. In step d) programming pulse profile data are stored in the memory device (or in another external memory), which data are associated with the individual programming pulse profiles defined in step c). The stored programming pulse profile data enable generation of programming pulses having the predefined programming pulse profiles each time when any programming operation is performed during normal mode operation of the memory device. Thereby sufficient reliability of programming operations is obtained for each individual conductive line.

Preferably, in step c) programming pulse profiles are defined that depend on the maximum threshold voltage of all respective memory cells connected to the particular conductive line. Since each memory cell may have a slightly different numerical value of the threshold voltage of the minimum programming voltage to be applied, the defined programming pulse profiles are chosen such that their programming voltage is larger than the maximum threshold voltage of any of the memory cells connected to the respective conductive line. Thereby reliable programming of all memory cells connected to a conductive line is assured.

Preferably, prior to step d), steps a), b) and c) are executed a second time, by the second execution programming memory cells of another, second memory area being programmed and for each conductive line of the second memory area individual programming pulse profiles being defined. Before executing step d), the defined programming pulse profiles obtained for the first memory area are compared with those defined for the second memory area in order to optimize the programming pulse profile data to be stored in step d). Since preferably programming pulse profiles shall be obtained that do not depend on the particular memory area (or their position or number) but that do depend on the conductive lines (or their number or position within the respective memory area), the programming pulse profiles and the corresponding programming pulse profile data should be individual with regard to the conductive lines but should be uniform for all memory areas. Thereby, a comparatively small number of individual programming pulse profiles is sufficient for reliably programming each memory cell within the memory device. Accordingly, in step d) programming pulse profile data are stored that result from testwise programming and evaluating of programming operations performed using the first area (and preferably at least the second memory). Yet further memory areas may be programmed testwise in order to more reliability evaluate systematic influences on programming reliability of the memory cells connected to the individual conductive lines, based on a larger number of memory areas programmed testwise.

Preferably, programming pulses having the individual programming pulse profiles defined upon programming the memory cells of the first memory area are used for programming of the second memory area. Accordingly, the improved programming pulse profiles obtained by testwise programming of the first memory area are used for testwise programming the memory cells of the second memory area. By evaluating the test results obtained from programming the second memory area, the programming pulse profiles to be stored may be improved further.

Alternatively, the programming pulses having a uniform programming pulse profile used when programming the first memory area are also used when programming the memory cells of the second memory area. Thereby the comparison with those test results achieved for the first memory area is easier.

Preferably, the method according to embodiments of the invention further comprises the steps of:

e) commonly erasing all memory cells of the first memory area;

f) sequentially programming all memory cells of the first memory area using programming pulses having individual programming pulse profiles generated in accordance with programming pulse profile data stored in step d), the programming pulse profiles depending on the evaluated number of memory cells that have actually been programmed in step a), the individual programming pulse profiles thus being associated with the respective conductive line to which the respective memory cells are connected;

g) evaluating for each conductive line of the first memory area the number of memory cells that have actually been programmed in step f);

h) defining for each conductive line of the first memory area new individual programming pulse profiles, the new individual programming pulse profiles depending on the number of memory cells connected to the respective conductive line which memory cells have been programmed in step f); and i) storing programming pulse profile data associated with the new programming pulse profiles defined, the stored programming pulse profile data serving to generate programming pulses having programming pulse profiles that depend on positions of the conductive lines within a memory area.

According to this embodiment, the first memory area is programmed twice (at least) and the individual programming pulse profiles obtained by testwise programming the first memory area for the first time are used for repeatedly programming the first memory area in step f). Since the individual programming pulse profiles have been defined in accordance with the evaluated number of memory cells actually programmed in step a), the individual programming pulse profiles are optimized such that they should enable reliable programming of all memory cells of the first memory area. When applying these individual programming pulse profiles in step f) and evaluating once again the number of memory cells actually programmed per conductive line, the result should be that all memory cells of the first memory area have now been programmed. In case that there are memory cells not yet programmed in step f), further modification of at least some of the individual programming pulse profiles is advisable. Finally, after an arbitrary number of iterations of repeatedly (at least once) programming the memory cells of the first memory area, in step e) the final programming pulse profile data allowing to generate optimized programming pulse profiles are stored. Optionally, the final programming pulse profiles may be used for testwise programming memory cells of further memory areas before operating the memory device in normal mode (other than test mode) and using the programming pulse profile data stored each time when any memory cell is to be programmed in normal mode operation.

According to an exemplary embodiment, defining of the individual programming pulse profiles includes defining individual programming pulse profiles for those conductive lines that are disposed close to edges of the first memory area (or of any other memory area), these individual pulse profiles being different from those defined for conductive lines disposed more distant from edges of the first memory area (or of any other memory area). According to this embodiment, those conductive lines surrounded by an arrangement of microelectronic structures different from the arrangement surrounding other conductive lines receive programming pulses of different programming pulse profiles. However, to each conductive line of a memory area a programming pulse profile being individual for the respective conductive line is assigned.

BRIEF DESCRIPTION OF THE DRAWINGS

The invention herein below is described with reference to the accompanying figures.

The following list of reference symbols can be used in conjunction with the figures:

| | |
|---|---|
| 1 | memory device |
| 2 | memory array |
| 3; 3a | conductive line |
| 3' | first conductive line |
| 3" | second conductive line |
| 4 | memory cell |
| 5 | memory area |
| 5' | first memory area |
| 5" | second memory area |
| 5a | edge of memory area |
| 7 | source/drain region |
| 10 | sector |
| 11 | bottom dielectric layer |
| 12 | charge-trapping layer |
| 13 | top dielectric layer |
| 14 | charge-trapping layer stack |
| 15 | pulse profile data storage |
| 16 | wordline |
| 20 | substrate |
| B1 | first bit |
| B2 | second bit |
| D | programming pulse profile data |
| I; II | threshold voltage distribution |
| L; L' | pulse width |
| L0 | uniform pulse width |
| n | position of conductive line |
| P | programming pulse |
| P0 | uniform programming pulse |
| PP; PP' | programming pulse profile |
| PP0 | uniform programming pulse profile |
| t | time |
| V | voltage |
| V0 | uniform programming voltage |
| VP; VP' | programming voltage |
| Vt | threshold voltage |
| VWL | wordline potential |

DETAILED DESCRIPTION OF ILLUSTRATIVE EMBODIMENTS

Figure 1:
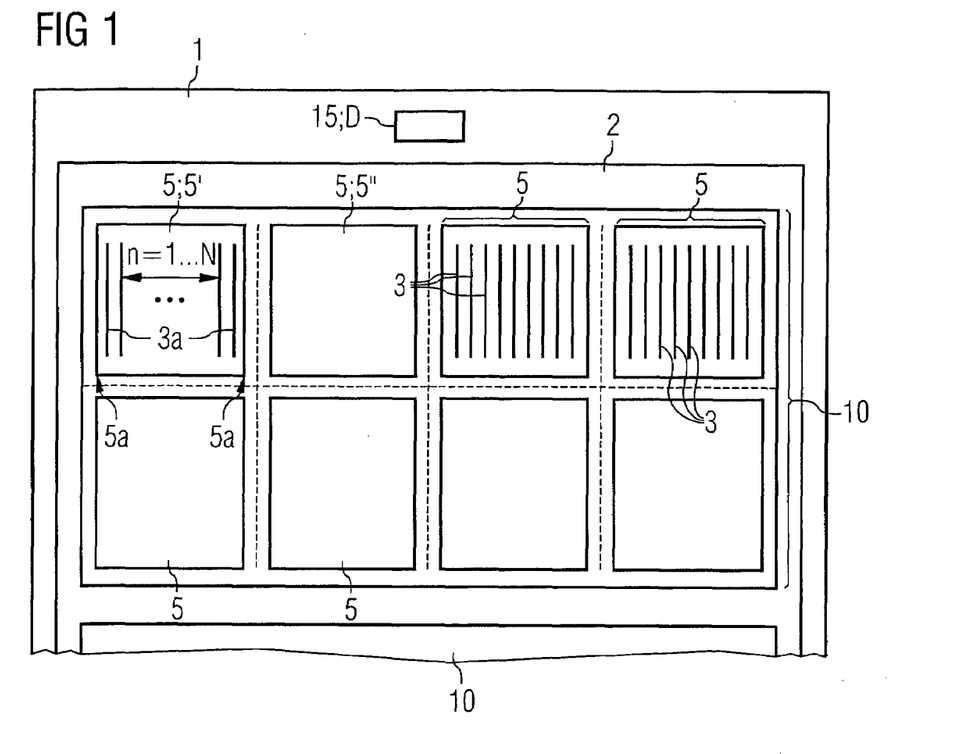
FIG. 1 is a schematical top view of a memory device according to the invention.

FIG. 1 illustrates a top view of a memory device 1 according to embodiments of the present invention. The memory device 1 comprises a memory array 2, which comprises a plurality of non-volatile memory cells. The memory cells are connected to conductive lines 3 which, for instance, may be bitlines. The memory array 2 preferably is a flash memory array comprising NROM memory cells or another kind of non-volatile memory cells. In case of a flash memory, the memory array 2 may be subdivided into plural sectors 10 comprising memory cells that can only be erased simultaneously within a particular sector. Accordingly, any memory cell within a sector is erased simultaneously with all other memory cells of the same sector 10.

Irrespective of whether the memory array 2 is subdivided in sectors 10 or is not, the memory array 2 in any case comprises a plurality of memory areas 5 that each are equally-sized and each comprise the same number of conductive lines 3 and the same number of memory cells connected to the conductive lines 3. The layout and the design of the memory areas 5 are corresponding to one another. The memory device 1 comprises a first memory area 5', a second memory area 5" and further memory areas. In each memory area 5 the conductive lines 3 are arranged in like manner and the respective positions of the conductive lines 3 within the memory areas 5 are identical (or at least mirror-inversed relative to one another). In particular, the arrangement of microelectronic structures surrounding the respective conductive line 3 are the same in all memory areas 5. Accordingly, in all memory areas 5 the positions of the conductive lines 3 may be enumerated likewise. For instance, in each memory area N conductive lines 3 are provided having positions n denoted with 1, 2, . . . , N. For instance, a first and an ultimate conductive line 3a in each memory area 5 are disposed close to edges 5a of the respective memory area 5. At the edges 5a, systematic influences due to the layout of the memory array 2 involve slightly different values of the threshold voltage, that is the minimum voltage at which the respective memory cell (connected to the respective first or ultimate conductive line 3a) is programmed. Accordingly, any programming voltage for programming memory cells connected to these conductive lines 3a must be larger than the threshold voltage, which may be different from the threshold voltage of memory cells connected to those conductive lines 3 arranged more distant from the edges 5a of the respective memory area 5.

There are further systematic influences on the threshold voltages of the memory cell, like lithographic misalignments during manufacturing of the memory device 1 or other design variations which are, at least in part, identical for all memory areas 5 of the memory array 2. Accordingly, if a programming operation is performed, the required programming voltage and/or programming pulse width may be different for each memory cell of a memory area. According to embodiments of the invention, the variation of the threshold voltage at least partially is compensated by application of individual programming pulses applied. In particular, according to embodiments of the invention in each memory area 5 programming pulses having programming pulse profiles individual for each conductive line 3 are applied in case that memory cells are to be programmed. Thereby systematic influences of the chip layout are compensated. The compensating programming pulse profiles are individual for each conductive line 3 within a memory area 5 but are common to all memory areas (since they are systematic). According to embodiments of the invention, the memory device 1 comprises a pulse profile data storage 15 in which programming pulse profile data D are storable or stored.

Figure 2:
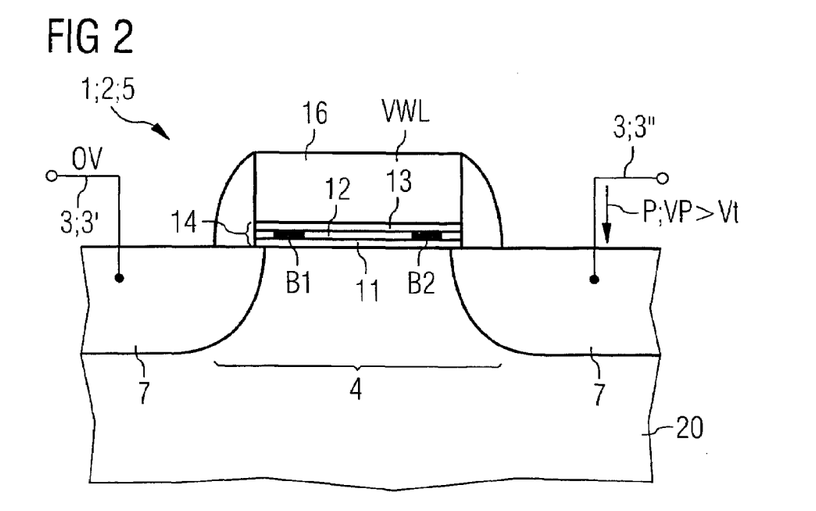
FIG. 2 is a cross-sectional view of a memory cell of the memory device of FIG. 1.

FIG. 2 is a cross-sectional view of a memory cell 4 connected to conductive lines 3 of the memory device of FIG. 1. In the embodiment of FIG. 2 the memory cell 4 is an NROM flash memory cell comprising a charge-trapping layer stack 14. The charge-trapping layer stack 14 is disposed between a substrate 20 and a wordline 16 forming the gate electrode of the memory cell 4. The memory cell 4 comprises two source/drain regions 7, each source/drain region being connected to a respective conductive line 3. The conductive lines 3 are illustrated schematically in FIG. 2. The conductive lines 3 preferably are bitlines.

The charge-trapping layer stack 14 is provided on a channel region of the substrate 20 in between both source/drain regions 7. The charge-trapping layer stack 14 comprises a bottom dielectric layer 11 arranged on the substrate 20, a charge-trapping layer 12 (preferably a nitride layer, in particular a silicon nitride layer) disposed on the bottom dielectric layer 11 as well as a top dielectric layer 13 disposed on the charge-trapping layer 12. The bottom dielectric layer 11 and the top dielectric layer 13 preferably are oxide layers, in particular silicon oxide layers. When an inversion channel is formed between both source/drain regions 7, at one lateral end of the charge-trapping layer 12 electrical charges (electrons and holes) may be scattered from the channel region through the bottom dielectric layer 11 into the charge-trapping layer 12, depending on the electric potentials applied to the wordline 16 and the conductive lines 3. For instance, one of the conductive lines 3 is set at a constant potential of 0 V, and the wordline 16 is biased with a wordline potential VWL. In order to program a bit in the memory cell 4, a programming pulse P having a programming voltage VP larger than the threshold voltage Vt of the memory cell 4 is supplied via the respective other conductive line 3. In FIG. 2, for instance, the electric potentials are illustrated for the case of programming a second bit B2 of a memory cell 4 capable of storing a first bit B1 and a second bit B2. In case that the potential of a first conductive line 3' is 0 V and a programming pulse P having an appropriate programming voltage VP and an appropriate pulse width is applied to the second conductive line 3", the second bit B2 is programmed by scattering electrons into the right side of the charge-trapping layer 12 in FIG. 2. However, when programming pulses P being uniform for all conductive lines 3 and for all memory cells 4 are supplied, there may be memory cells that are not actually programmed because the threshold voltage Vt of these respective memory cells 4 is increased due to systematic variations in the design of microelectronic structures surrounding the respective memory cell or the respective conductive line. For instance, as apparent from FIG. 1, in each memory area 5 a first and an ultimate conductive line 3a are arranged along edges 5a of the respective memory area 5. These outer conductive lines preferably are biased with programming pulses being different from programming pulses applied to conductive lines 3 arranged more distant from the edges 5a of the memory areas. In general, for each position n of any conductive line 3 within a memory area 5 an individual programming pulse profile is defined and stored in the programming pulse profile data storage 15.

Figure 3:
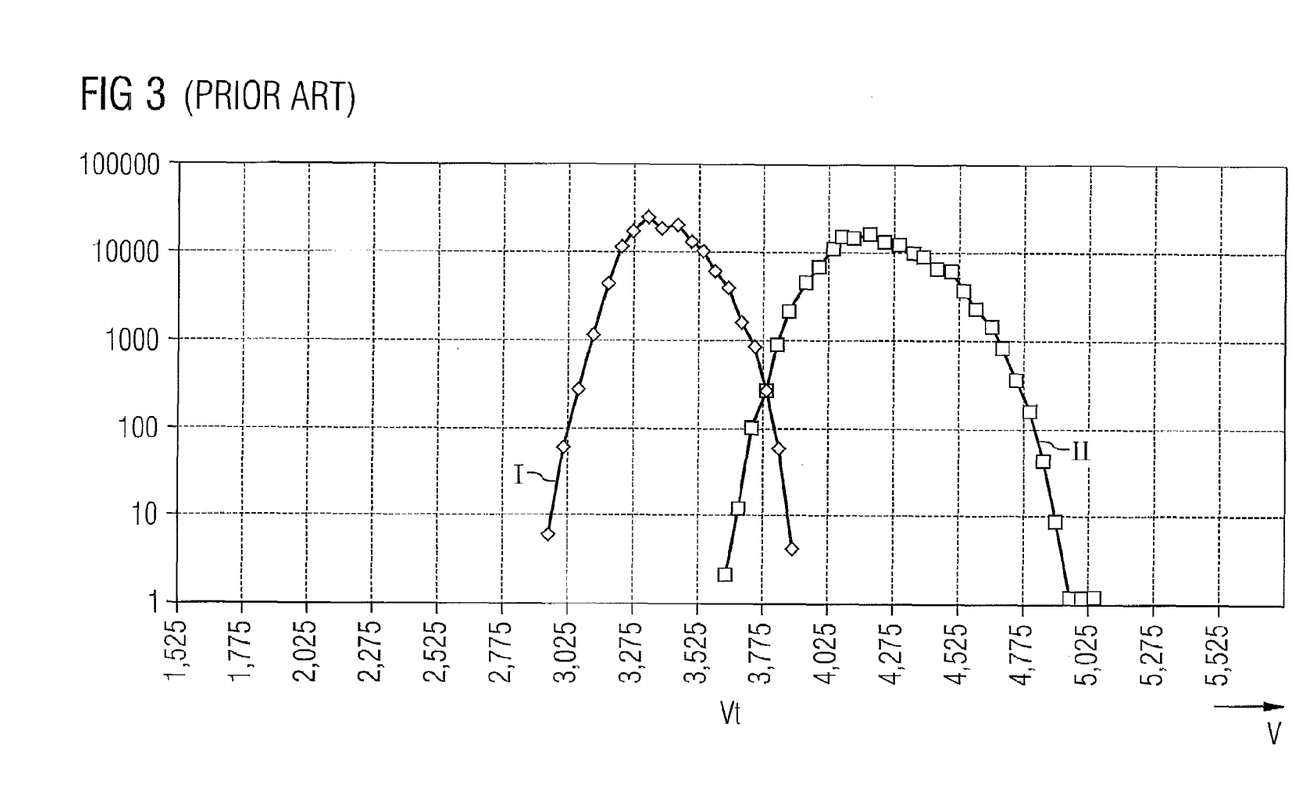
FIG. 3 is a schematical diagram of the distribution of threshold voltages for the memory cells of a conventional memory device before and after programming.

FIG. 3 illustrates the distribution of threshold voltages Vt for the memory cells of a conventional memory device before and after programming. On the horizontal axis the numerical values of the threshold voltage Vt (in Volts V) are denoted. On the vertical axis the number of memory cells having a particular magnitude of the threshold voltage Vt is illustrated. The function I illustrates the threshold voltage distribution before programming, that is the threshold voltage distribution of or non-programmed erased memory cells. The second function II illustrates the threshold voltage distribution after programming. According to the function I, the threshold voltage Vt is not uniform for all memory cells. Instead, the magnitude of the threshold voltage Vt is different for the plural memory cells due to systematic and statistical influences.

After programming of the memory cells, the threshold voltage Vt is increased as apparent from the function II shifted to the right side in FIG. 3 compared to the function I in FIG. 3. More important, the width of the distribution of threshold voltages Vt after programming (function II) is larger compared to the distribution before programming (function I). The increased standard deviation of the distribution of threshold voltages renders it difficult to reliably program all memory cells by means of a programming voltage chosen slightly larger than the average threshold voltage. However, due to systematic design influences, there are some conductive lines requiring increased (or decreased) programming voltages in case that any memory cell connected to the respective conductive line is to be programmed. Accordingly, the distribution of the magnitude of threshold voltages Vt for memory cells connected to a particular conductive line may be different from the function II in FIG. 3.

It is an idea of the present invention to compensate, for each conductive line, the systematic influences by providing programming pulses that are individual for the respective conductive line, thereby compensating the increased width of the function II in FIG. 3.

Figure 4:
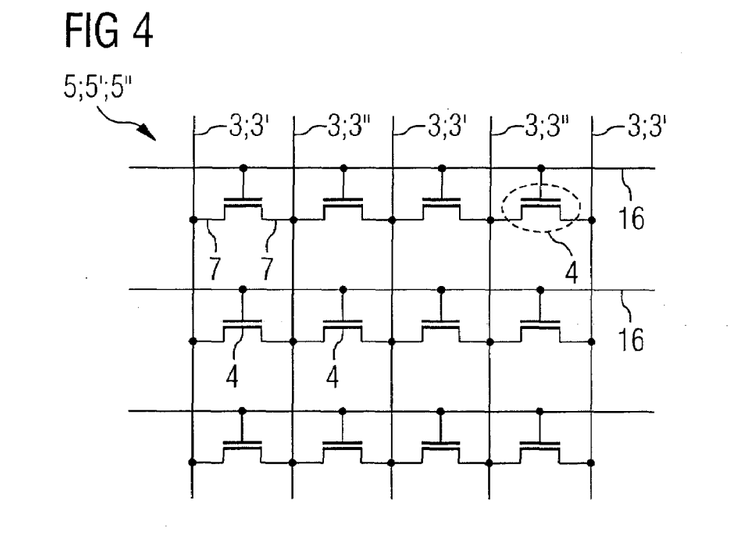
FIG. 4 is a schematical wiring diagram of a memory area according to an embodiment of the invention.

FIG. 4 illustrates a schematical wiring diagram of a memory area 5 of a memory device according to embodiments of the invention. In the embodiment of FIG. 4, the memory area 5 comprises a plurality of conductive lines 3, which preferably are bitlines and further comprises a plurality of wordlines 16. A plurality of memory cells 4 (which may be constructed and illustrated in FIG. 2, for instance) is connected to the conductive lines 3 (bitlines) and to the wordlines 16. In the particular embodiment of FIG. 4, each memory cell is connected to two respective conductive lines 3', 3". Accordingly, the memory cells 4 are twin-flash cells capable of storing two respective bits, at minimum. Accordingly, when a respective wordline 16 is biased with a wordline potential of appropriate magnitude and a programming pulse is applied to one of the conductive lines 3', 3" to which the memory cell 4 is connected, one bit is programmed in the respective memory cell.

In a conventional memory device, for programming of any of the memory cells 4, a programming pulse having a predefined uniform programming pulse profile is applied. The programming pulse has a predefined, uniform programming voltage and a predefined, uniform pulse width indicating the duration of application of the programming voltage to the respective conductive line. However, if the threshold voltage of the particular memory cell is larger than the programming voltage of the programming pulse, for instance, this particular memory cell is not programmed at once. At least, repeated application of the uniform programming pulse may be required, thereby drastically reducing the performance of programming operations. Alternative prior art techniques use systemically increasing the programming pulse voltage or the programming pulse duration when a plural pulse is applied sequentially to one and the same memory cell to be programmed. Due to this technique of "stepping", some memory cells receive more than one programming pulse applied since these memory cells have not actually been programmed by application of the first programming pulse.

According to the invention, however, only one programming pulse needs to be applied to each memory cell, which programming pulse has a programming pulse profile chosen such that a reliable programming of any memory cell connected to the respective conductive line is achieved.

Figure 5:
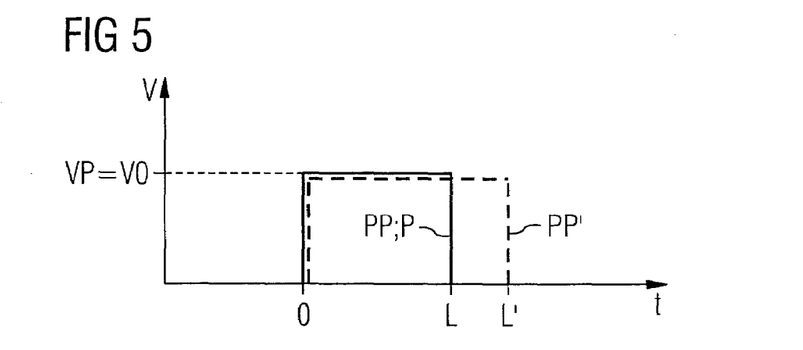
FIG. 5 is a schematical diagram of programming pulse profiles in case of pulse width variation according to one embodiment.

FIG. 5 illustrates a first embodiment of individually choosing the programming pulse profile of programming pulses to be applied for programming memory cells. Conventionally, a uniform programming pulse having a standardized, uniform programming voltage V0 and a standard, uniform programming pulse width is applied. According to this embodiment of the invention, however, programming pulses P of varying, individually chosen pulse widths L, L' are applied to the conductive lines, for each conductive line a programming pulse P having an individual programming pulse profile PP, PP'. According to the embodiment of FIG. 5, the programming voltage VP is equal for all programming pulse profiles P and corresponds to the uniform programming voltage V0. However, the pulse width L, L' is chosen individually for each conductive line via which the respective programming pulse is to be supplied to a memory cell to be programmed. Whereas in FIG. 5 only two different pulse profiles PP, PP' of different pulse widths L, L' are illustrated, it is to be noted that actually there are N individually chosen programming pulse profiles, each programming pulse profile corresponding to a respective position n (FIG. 1) of the respective conductive line 3 within a respective memory area 5. These individually chosen programming pulse profiles are independent from the particular memory area 5 in which the conductive lines are arranged. Thereby systematic influences on the internal memory array design are compensated.

Figure 6:
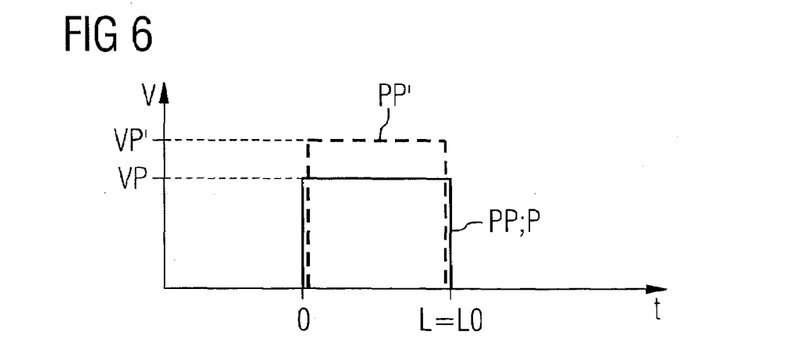
FIG. 6 is a schematical diagram of programming pulse profiles in case of programming voltage variation according to a further embodiment.

FIG. 6 illustrates an alternative embodiment of individually varying programming pulse profiles of programming pulses P to be applied via the conductive lines to the memory cells. According to FIG. 6 the pulse width L of the programming pulses is chosen uniform and corresponds to a standardized, uniform pulse width L0. However, the programming voltage is chosen individually for each conductive line position within a memory area. Accordingly, N different pulse profiles of different programming voltages are to be applied to the conductive lines of a memory area. In FIG. 6, for easier illustration only two programming pulse profiles PP, PP' are illustrated that have different programming voltages VP, VP' for compensating different threshold voltage magnitudes of the memory cells connected to the respective conductive line. When a memory cell connected to a particular conductive line is to be programmed by supplying a programming pulse via the respective conductive line, the predefined programming pulse profile associated with this conductive line is generated and applied, via the conductive line, to the memory cell to be programmed. The programming pulse profile is chosen individually for the conductive line such that each memory cell connected to this conductive line is reliably programmed by application of only one (individual) programming pulse.

It is to be noted that the embodiments of FIGS. 5 and 6 may be combined with one another, thereby individually defining the programming voltage VP as well as the pulse width L of the programming pulse profiles attributed to each conductive line within a memory area. Furthermore, it is to be noted that alternative ways of individually shaping the programming pulse profiles may be chosen. However, according to the invention to each position of a conductive line within a memory area one respective programming pulse profile is associated. The memory device generates a corresponding programming pulse each time when a memory cell connected to the respective conductive line is to be programmed.

For generating individual programming pulse profiles, programming pulse profile data are stored in the memory device. The programming pulse profile data may indicate, for instance, the individually defined programming voltages and pulse widths of the stored programming pulse profiles.

Figure 7:
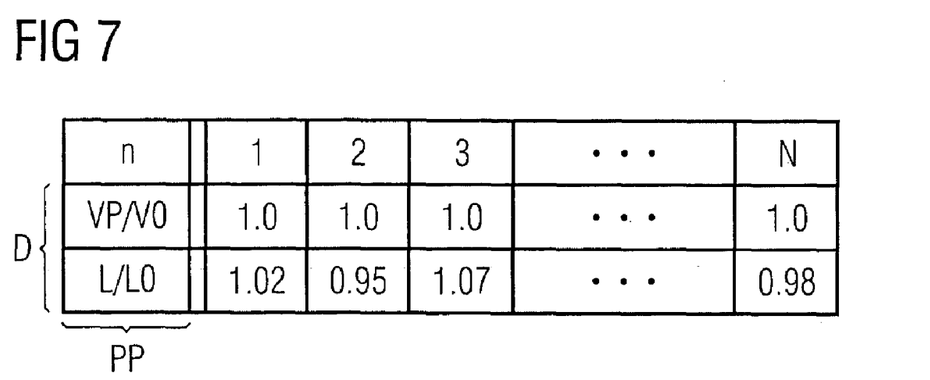
FIG. 7 is a tabulated list of programming pulse profile data in case of pulse length variation according to the embodiment of FIG. 5.

FIG. 7 illustrates a tabular list of programming pulse profile data D associated with the positions n of conductive lines 3 (FIG. 1) within a memory area. For each position n a respective programming pulse profile PP is defined by the corresponding programming voltage VP and the corresponding pulse width L. In the tabular list of FIG. 7, the programming voltage VP corresponds to a standard uniform programming voltage V0 for each of the N conductive lines within a memory area. Accordingly, the programming voltage is constant for all memory cells to be programmed. However, the pulse width L is varying for each position n of the respective conductive line transmitting the programming pulse to the memory cell to be programmed. In particular, the numerical value of the individual pulse width L divided by a standardized uniform pulse width L0 is defined individually for each conductive line position. For instance, for the first and third conductive line within a memory area the pulse width is increased whereas for the second and the ultimate conductive line of the memory area the pulse width is decreased. These pulse widths are chosen such that all memory cells within an arbitrary memory area are reliably programmed by application of only one single (individually designed) programming pulse. The programming pulse profile PP identified by the individually chosen programming voltages VP and pulse widths L are represented by programming pulse profile data D that are storable or stored in a programming pulse profile data storage 15 (FIG. 1) of the memory device 1, for instance.

Figure 8:
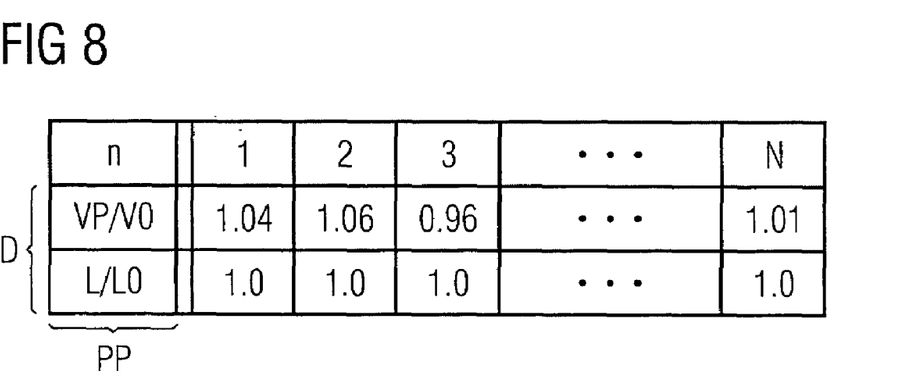
FIG. 8 is a tabulated list of programming pulse profile data in case of programming voltage variation according to the embodiment of FIG. 6.

FIG. 8 illustrates an alternative embodiment of individually defining programming pulse profiles according to an embodiment of the invention. According to FIG. 8, the pulse width L of programming pulses is identical for all conductive lines irrespective of their position n within the respective memory area 5 (FIG. 1). However, according to this embodiment, the programming voltage VP is chosen individually for each conductive line position n. For instance the programming voltage VP for the first, second and ultimate conductive line is chosen larger than a predefined uniform programming voltage whereas the programming voltage of the third conductive line is smaller than the uniform programming voltage V0. It is to be stated that programming voltage variation according to FIGS. 8 and 6 may be combined with pulse width variation of FIGS. 7 and 5 for individually choosing the respective programming voltage magnitude as well as the respective pulse width magnitude for each conductive line position within the memory areas.

Figure 9:
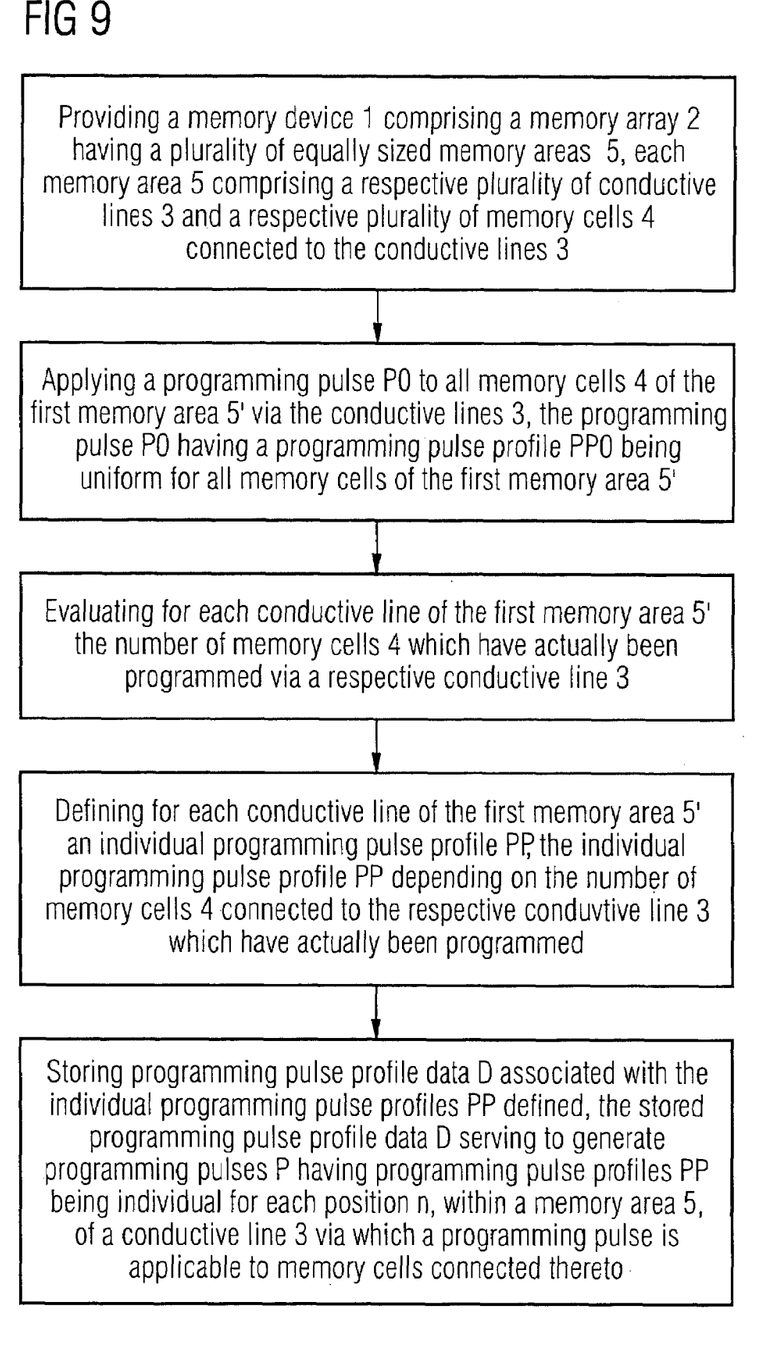
FIG. 9 is a schematical diagram of the process flow of a method according to the invention.

FIG. 9 illustrates a schematic view of a process flow according to an embodiment of the invention. According to FIG. 9, the memory device is provided, the memory device having a memory array 2 with a plurality of equally designed memory areas 5, each memory area 5 comprising the same number of conductive lines 3 and the same number of memory cells 4 arranged in like manner. Accordingly, there are systematic influences on the threshold voltages (and the required programming pulse profiles), which are identical for each memory area. According to the process of FIG. 9, in a first, arbitrary memory area 5' all memory cells 4 are subjected to programming pulses in order to sequentially program these memory cells. Since the memory cells are to be programmed for the first time, programming pulses having uniform programming pulse profiles being independent from the position n of the conductive lines 3 are applied to all memory cells 4 of the first memory area. After applying these programming pulses to the first memory area, it is evaluated for each conductive line 3 of the first memory area 5' how many memory cells 4 have actually programmed via the respective conductive line 3. To this end, a sensing operation is performed in order to read out the bits stored in the memory cells of the first memory area. Since the threshold voltage Vt is systematically influenced by design effects depending on the position n of the respective conductive line, the number of memory cells actually programmed with the uniform programming pulse profile may be different for each individual conductive lines of the memory area.

Subsequently, depending on the evaluated numbers of memory cells per conductive line which have actually been programmed, individual programming pulse profiles are defined for each conductive line which reliably enable programming of any respective memory cell connected to a respective conductive line via which the individual programming pulse is applied. The defined programming pulse profiles are chosen such that no stepping or other repeated application of plural programming pulses is required.

Finally, programming pulse profile data D associated with the individual programming pulse profiles PP are stored in the memory device, for instance in a pulse profile data storage 15 thereof (FIG. 1) or in another memory region connected to or comprised in the memory device. The stored programming pulse profile data serve to generate programming pulses having the predefined programming pulse profiles (being individual for the positions n of the conductive lines 3 within the respective memory area 5) each time when any memory cell is to be programmed (and a programming pulse is to be applied to this memory cell via the respective conductive line therefore). Optionally, before finally storing the programming pulse profile data, the individually defined programming pulse profiles may be used for (erasing and) repeatedly programming all memory cells of the first memory area in order to repeatedly optimize of the individual programming pulse profiles. Alternatively or in addition thereto, the individually defined programming pulse profiles may be used for programming memory cells of at least one further memory area 5" in order to more reliably evaluate those memory design influences that are systematic due to the average layout of the memory areas 5. By iteratively applying individually defined, optimized programming pulse profiles to the memory cells of any memory area, appropriate final programming pulse profiles are evaluated and final programming pulse profile data corresponding to these final, optimized programming pulse profiles are stored in a non-volatile manner. The programming pulse profile data thereby enable generation of individual programming pulse profiles on-chip within the memory device 1.

By means of programming pulse modulation according to the invention, any systematic array effects reducing the programming performance are compensated.

What is claimed is:

1. A memory device comprising:
a memory array having at least one memory area, which comprises a plurality of conductive lines and a plurality of memory cells coupled to the conductive lines, the conductive lines being arranged at positions within the memory area;
wherein the memory cells are erasable and wherein the memory cells are programmable by application of an electrical programming pulse supplied via a respective conductive line; and
wherein the memory device is constructed such that for programming of a memory cell an electrical programming pulse is applied that has a programming pulse profile depending on the position (n) of a respective conductive line to which the memory cell is connected.

2. The memory device of claim 1, wherein the memory device for programming a memory cell generates a programming pulse having a programming pulse profile that depends on the position, within the memory area, of a respective conductive line to which the memory cell is connected.

3. The memory device of claim 1, wherein the memory array comprises a plurality of equally-sized memory areas, each memory area comprising a respective plurality of conductive lines and a plurality of memory cells connected to the respective conductive lines, and wherein the conductive lines of each memory area are arranged at positions that correspond to positions of the conductive lines of the other memory areas.

4. The memory device of claim 3, wherein the memory device for programming a memory cell generates a programming pulse having a programming pulse profile that depends on the position, within the respective memory area, of a conductive line to which the memory cell is connected.

5. The memory device of claim 3, wherein the memory device attributes programming pulse profile data corresponding to programming pulses having individual programming pulse profiles to the conductive lines of the memory areas, wherein to all conductive lines located at the same corresponding position in any one of the respective memory areas the same programming pulse profile data are attributed.

6. The memory device of claim 1, wherein programming pulse profile data are stored in the memory device.

7. The memory device of claim 1, wherein the memory device for programming of a respective memory cell generates a programming pulse having a programming pulse width depending on the respective programming pulse profile data.

8. The memory device of claim 7, wherein the memory device for programming of a respective memory cell generates a programming pulse of a programming voltage that is uniform for all memory cells of the memory array.

9. The memory device of claim 1, wherein the memory device for programming of a respective memory cell generates a programming pulse having a programming voltage depending on the respective programming pulse profile data.

10. The memory device of claim 9, wherein the memory device for programming of a respective memory cell generates a programming pulse of a programming pulse width being uniform for all memory cells of the memory array.

11. The memory device of claim 1, wherein the conductive lines are bitlines.

12. The memory device of claim 1, wherein the nonvolatile memory cells each comprise a charge-trapping layer stack disposed between a respective wordline and a respective active area.

13. The memory device of claim 12, wherein the charge-trapping layer stack comprises a charge-trapping layer sandwiched between a bottom dielectric layer and a top dielectric layer.

14. The memory device of claim 13, wherein the charge-trapping layer comprises a silicon nitride layer.

15. The memory device of claim 1, wherein the memory array comprises a plurality of sectors, each sector comprising a plurality of equally-sized memory areas, the memory cells of all memory areas of a sector being commonly erased when erasing memory cells of the respective sector.

16. The memory device of claim 1, wherein the memory device, for programming of a memory cell connected to a conductive line disposed close to an edge of any one of the memory areas, generates a programming pulse having a programming pulse profile being different from programming pulse profiles for programming of memory cells connected to conductive lines disposed more distant from the edges of the memory areas.

17. The memory device of claim 1, wherein each memory cell is connected to a respective first and second conductive line via which the programming pulses are supplied to the respective memory cell and wherein each memory cell is capable of storing at least one first bit in a first bit position and at least one second bit in a second bit position.

18. The memory device of claim 17, wherein the memory device is configured such that the at least one first bit of a memory cell is programmed by applying the programming pulse to the memory cell via the first conductive line and that the at least one second bit of the memory cell is programmed by applying the programming pulse to the memory cell via the second conductive line.

19. A method of operating a memory device, the method comprising:
providing a memory array having at least one memory area that comprises a plurality of conductive lines and a plurality of memory cells coupled to the conductive lines; and
programming at least one memory cell by applying a programming pulse to a respective conductive line to which the respective memory cell is coupled, wherein programming of the memory cell includes generating a programming pulse having a programming pulse profile that depends on a position, within the memory area, of the conductive line to which the memory cell to be programmed is coupled.

20. The method of claim 19, wherein programming of the memory cell includes generating a programming pulse in accordance with programming pulse profile data stored in the memory device.

21. The method of claim 20, wherein programming of a memory cell includes generating a programming pulse that is independent of the respective individual memory area in which the conductive line is arranged.

22. The method of claim 20, wherein programming of a memory cell includes generating a programming pulse having a pulse width that is individual for a conductive line to which the memory cell to be programmed is coupled, the programming pulse being defined by programming pulse profile data associated with the position, within the memory area, of the conductive line.

23. The method of claim 22, wherein programming of the memory cell includes generating a programming pulse having a programming voltage that is uniform for all memory cells of the memory array.

24. The method of claim 20, wherein programming of a memory cell includes generating a programming pulse having a programming voltage that is individual for a conductive line to which the memory cell to be programmed is coupled, the programming pulse being defined by programming pulse profile data associated with a position, within the memory area, of the conductive line.

25. The method of claim 24, wherein programming of the memory cell includes generating a programming pulse having a programming pulse width that is uniform for all memory cells of the memory array.

26. The method of claim 19, wherein the memory device is configured such that each time a memory cell is to be programmed, the memory device generates a respective electrical programming pulse having a programming pulse profile that depends on the position, within the memory area, of the conductive line to which the respective memory cell is coupled.

27. The method of claim 19, wherein the memory cells comprise source/drain regions coupled to the respective conductive line, the generated programming pulse being supplied to the source/drain region of the respective memory cell to be programmed.

* * * * *

UNITED STATES PATENT AND TRADEMARK OFFICE
CERTIFICATE OF CORRECTION

PATENT NO. : 7,342,829 B2 Page 1 of 1
APPLICATION NO. : 11/241817
DATED : March 11, 2008
INVENTOR(S) : Koebernick et al.

It is certified that error appears in the above-identified patent and that said Letters Patent is hereby corrected as shown below:

On the Title Page, Section (56) References Cited, U.S. PATENT DOCUMENTS, Page 1, column 2, 2nd entry, delete "2005/0057987" and insert --2005/0057967--.

Signed and Sealed this

First Day of July, 2008

JON W. DUDAS
*Director of the United States Patent and Trademark Office*